United States Patent
Tamura

(10) Patent No.: US 9,531,383 B2
(45) Date of Patent: Dec. 27, 2016

(54) SEMICONDUCTOR DEVICE AND METHOD OF CONTROLLING THE SAME

(71) Applicant: Sony Semiconductor Solutions Corporation, Kanagawa (JP)

(72) Inventor: Masahisa Tamura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 14/608,279

(22) Filed: Jan. 29, 2015

(65) Prior Publication Data
US 2015/0236679 A1 Aug. 20, 2015

(30) Foreign Application Priority Data

Feb. 17, 2014 (JP) ................. 2014-027607

(51) Int. Cl.
*H03K 3/017* (2006.01)
*H03K 19/00* (2006.01)
*G06F 1/32* (2006.01)

(52) U.S. Cl.
CPC ......... *H03K 19/0008* (2013.01); *G06F 1/3287* (2013.01); *Y02B 60/1282* (2013.01)

(58) Field of Classification Search
None
See application file for complete search history.

(56) References Cited

U.S. PATENT DOCUMENTS

2005/0157559 A1* 7/2005 Lee ................. G09G 3/3648
365/185.22
2009/0261892 A1* 10/2009 Joo ................. G11C 5/145
327/536

FOREIGN PATENT DOCUMENTS

JP 2006-065471 3/2006

* cited by examiner

*Primary Examiner* — Cassandra Cox
(74) *Attorney, Agent, or Firm* — Michael Best & Friedrich LLP

(57) ABSTRACT

A semiconductor device includes: a first signal generation section configured to generate an activation signal having a variable duty ratio; and a first processing section configured to perform intermittent operation, based on the activation signal.

19 Claims, 17 Drawing Sheets

SEMICONDUCTOR DEVICE AND METHOD OF CONTROLLING THE SAME

CROSS REFERENCE TO RELATED APPLICATIONS

This application claims the benefit of Japanese Priority Patent Application JP 2014-027607 filed Feb. 17, 2014, the entire contents of which are incorporated herein by reference.

BACKGROUND

The present disclosure relates to a semiconductor device provided with a circuit performing intermittent operation, and to a control method used in such a semiconductor device.

In recent years, a power circuit is often mounted in an integrated circuit. Accordingly, in an electronic apparatus provided with such an integrated circuit, it is possible to achieve reduction in the number of components, improvement in design flexibility, reduction in consumed power, and the like.

A method of dynamically controlling power supply to each circuit depending on an operation state of a system in order to further reduce consumed power in such an integrated circuit has been known. For example, in Japanese Unexamined Patent Application Publication No. 2006-65471, a power saving control method in which an integrated circuit is sectioned into predetermined various kinds of functional blocks, a clock enable signal is sequentially inactivated by a certain time difference to each of the functional blocks to make the transition from a normal mode to a power saving mode is disclosed. Accordingly, in the integrated circuit, malfunction of the integrated circuit caused by drastic decline of the power voltage in the transition to the power saving mode is prevented.

SUMMARY

As described above, in the integrated circuit, consumed power is desirably reduced while preventing malfunction, and the consumed power is expected to be reduced while maintaining performance of the circuit.

It is desirable to provide a semiconductor device and a method of controlling the semiconductor device that are capable of reducing consumed power while maintaining performance of a circuit.

According to an embodiment of the disclosure, there is provided a semiconductor device including: a first signal generation section configured to generate an activation signal having a variable duty ratio; and a first processing section configured to perform intermittent operation, based on the activation signal.

According to an embodiment of the disclosure, there is provided a method of controlling a semiconductor device. The method includes: varying a duty ratio of an activation signal; and allowing a first processing section to perform intermittent operation, based on the activation signal.

In the semiconductor device and the method of controlling the semiconductor device according to the respective embodiments of the disclosure, the intermittent operation is performed by the first processing section, based on the activation signal generated by the first signal generation section. The activation signal is variable in duty ratio.

In the semiconductor device and the method of controlling the semiconductor device according to the respective embodiments of the disclosure, the duty ratio of the activation signal is allowed to be variable. Therefore, it is possible to reduce consumed power while maintaining performance of the circuit. Note that effects described here are non-limiting. Effects achieved by the technology may be one or more of effects described in the present disclosure.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Hereinafter, an embodiment of the disclosure will be described in detail with reference to drawings.

Configuration Example

Figure 1:
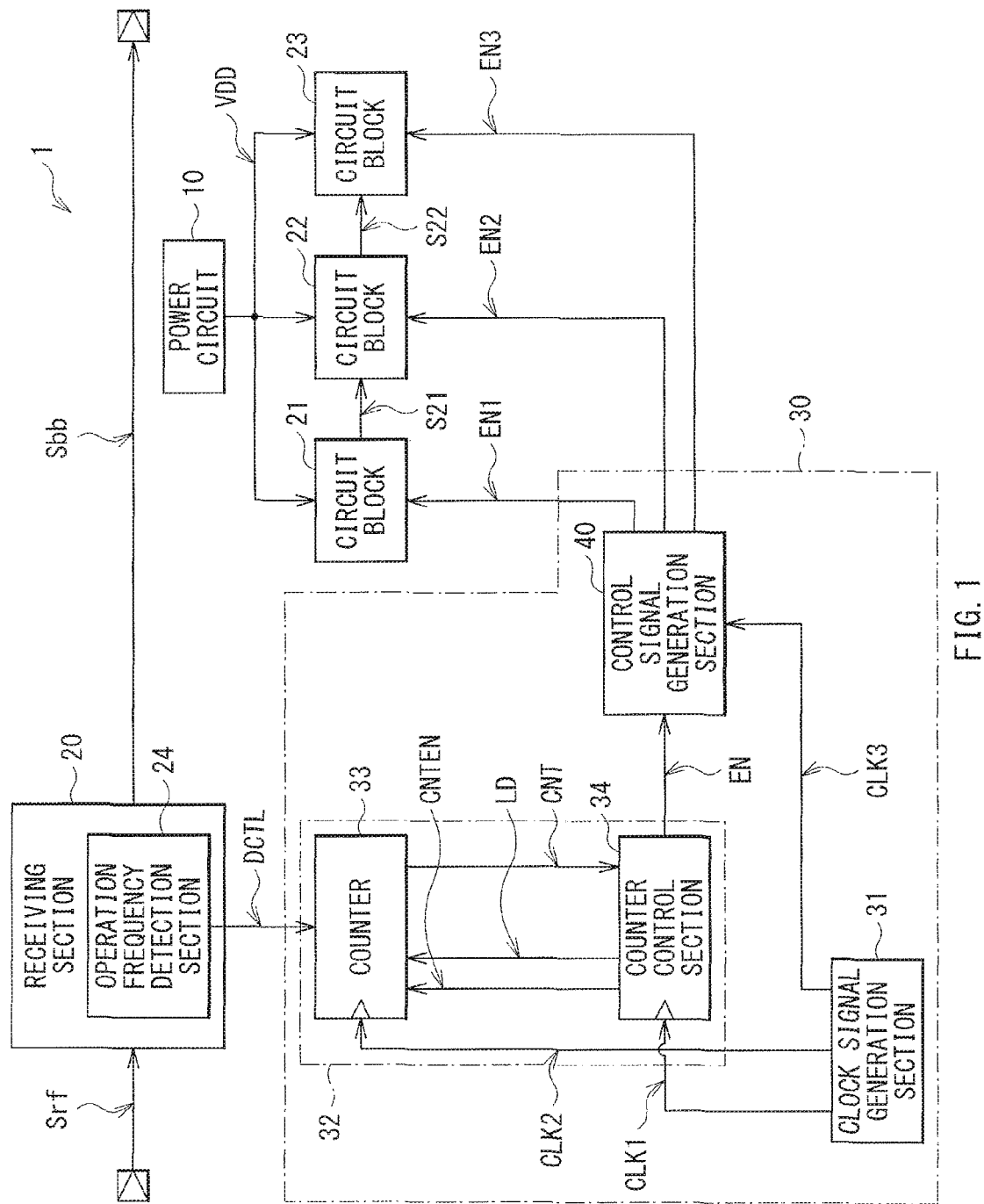
FIG. 1 is a block diagram illustrating a configuration example of a receiver according to an embodiment of the disclosure.

FIG. 1 illustrates a configuration example of a receiver to which a semiconductor device according to an embodiment of the disclosure is applied. A receiver 1 is a device receiving a wireless signal in a wireless communication system. Note that a method of controlling a semiconductor device according to an embodiment of the disclosure is embodied by the present embodiment, and thus the method will be described together. The receiver 1 includes a power circuit 10, a receiving section 20, circuit blocks 21 to 23, and an intermittent operation control section 30.

The power circuit 10 supplies a power voltage VDD to each circuit in the receiver 1. Specifically, for example, the power circuit 10 may be configured using a regulator and the like, and generates the power voltage VDD, based on a power voltage VDD1 (not illustrated) supplied from the outside of the receiver 1. Incidentally, in FIG. 1, the power circuit 10 is illustrated to supply the power voltage VDD to the circuit blocks 21 to 23; however, the power circuit 10 supplies the power voltage VDD to all of other circuits similarly.

The circuit blocks 21 to 23 each receive supply of the power voltage VDD from the power circuit 10, to perform predetermined operation. At this time, the circuit blocks 21 to 23 perform intermittent operation based on control signals EN1 to EN3, respectively. Specifically, the circuit block 21 performs predetermined operation to generate a signal S21 when the control signal EN1 is active, whereas stops the operation when the control signal EN1 is inactive. The circuit block 22 performs predetermined operation to generate a signal S22 based on the signal S21 when the control signal EN2 is active, whereas stops the operation when the control signal EN2 is inactive. The circuit block 23 performs predetermined operation based on the signal S22 when the control signal EN3 is active, whereas stops the operation when the control signal EN3 is inactive. As will be described later, the control signals EN1 to EN3 are different in transition timing from one another. The circuit blocks 21 to 23 each perform the intermittent operation in this way to reduce consumed power.

Incidentally, although the three circuit blocks 21 to 23 perform the intermittent operation in this example, the number of circuit blocks is not limited thereto. Alternatively, for example, two circuit blocks may perform the intermittent operation, or four or more circuit blocks may perform the intermittent operation.

The receiving section 20 generates a baseband signal Sbb based on a signal Srf supplied from a receiving antenna (not illustrated). The receiving section 20 includes an operation frequency detection section 24. The operation frequency detection section 24 detects an operation frequency of the receiving section 20, and generates a duty ratio control word DCTL that is formed of a plurality of bits, based on the detection result. Specifically, for example, the operation frequency detection section 24 detects a carrier frequency of the signal Srf, that is, a channel in which wireless communication is performed, and generates the duty ratio control word DCTL based on the detection result. The duty ratio control word DCTL indicates an initial value of a count value CNT in a counter 33 of the intermittent operation control section 30, as will be described later.

The intermittent operation control section 30 generates the control signals EN1 to EN3, based on the duty ratio control word DCTL. The intermittent operation control section 30 includes a clock signal generation section 31, an activation signal generation section 32, and a control signal generation section 40.

The clock signal generation section 31 generates clock signals CLK1 to CLK3. A frequency of the clock signal CLK1 is lower than that of the clock signal CLK2, and the frequency of the clock signal CLK2 is lower than that of the clock signal CLK3. Specifically, for example, the frequency of the clock signal CLK1 may be about 8 MHz, the frequency of the clock signal CLK2 may be about 250 MHz, and the frequency of the clock signal CLK3 may be about 1 GHz.

The activation signal generation section 32 generates an activation signal EN, based on the duty ratio control word DCTL and the clock signals CLK1 and CLK2. The activation signal generation section 32 has the counter 33 and a counter control section 34.

The counter 33 counts down pulses of the clock signal CLK2, based on the duty ratio control word DCTL, a load signal LD, and a counter activation signal CNTEN, and outputs the count value CNT. Specifically, as will be described later, when the load signal LD becomes active, the counter 33 takes in a value indicated by the duty ratio control word DCTL as the initial value of the count value CNT. Then, the counter 33 counts down the pulses of the clock signal CLK2 from the initial value during a period when the counter activation signal CNTEN is active.

The counter control section 34 controls the counter 33, and generates the activation signal EN based on the counter value CNT. Specifically, the counter control section 34 generates the load signal LD and the counter activation signal CNTEN, based on the clock signal CLK1, and controls the counter 33 through these signals. Then, the counter control section 34 generates the activation signal EN based on the count value CNT.

With this configuration, as will be described below, the activation signal generation section 32 generates the activation signal EN that has the same period as that of the clock signal CLK1 and has a duty ratio corresponding to the duty ratio control word DCTL.

Figure 2:
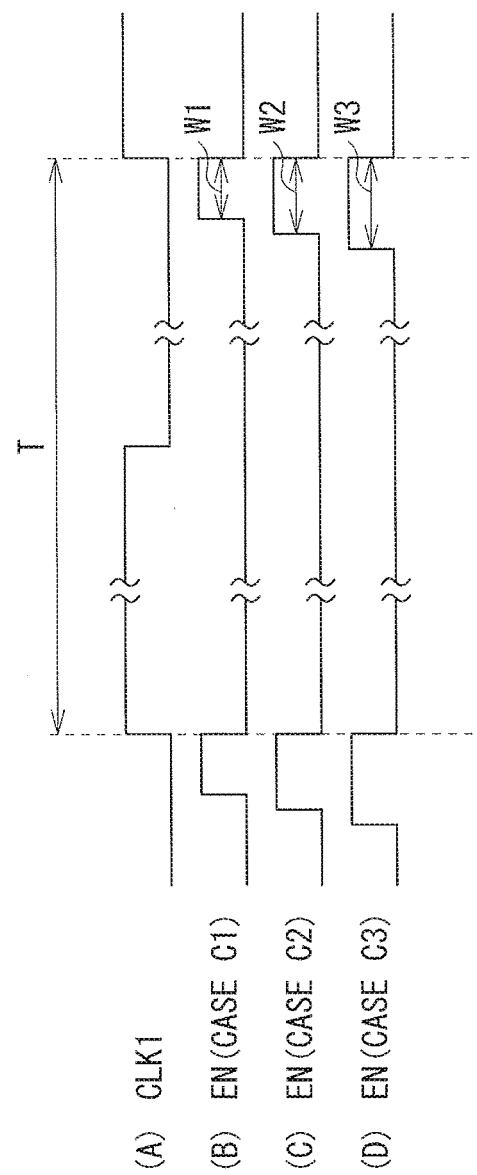
FIG. 2 is a timing waveform chart illustrating an example of an activation signal illustrated in FIG. 1.
Figure 3:
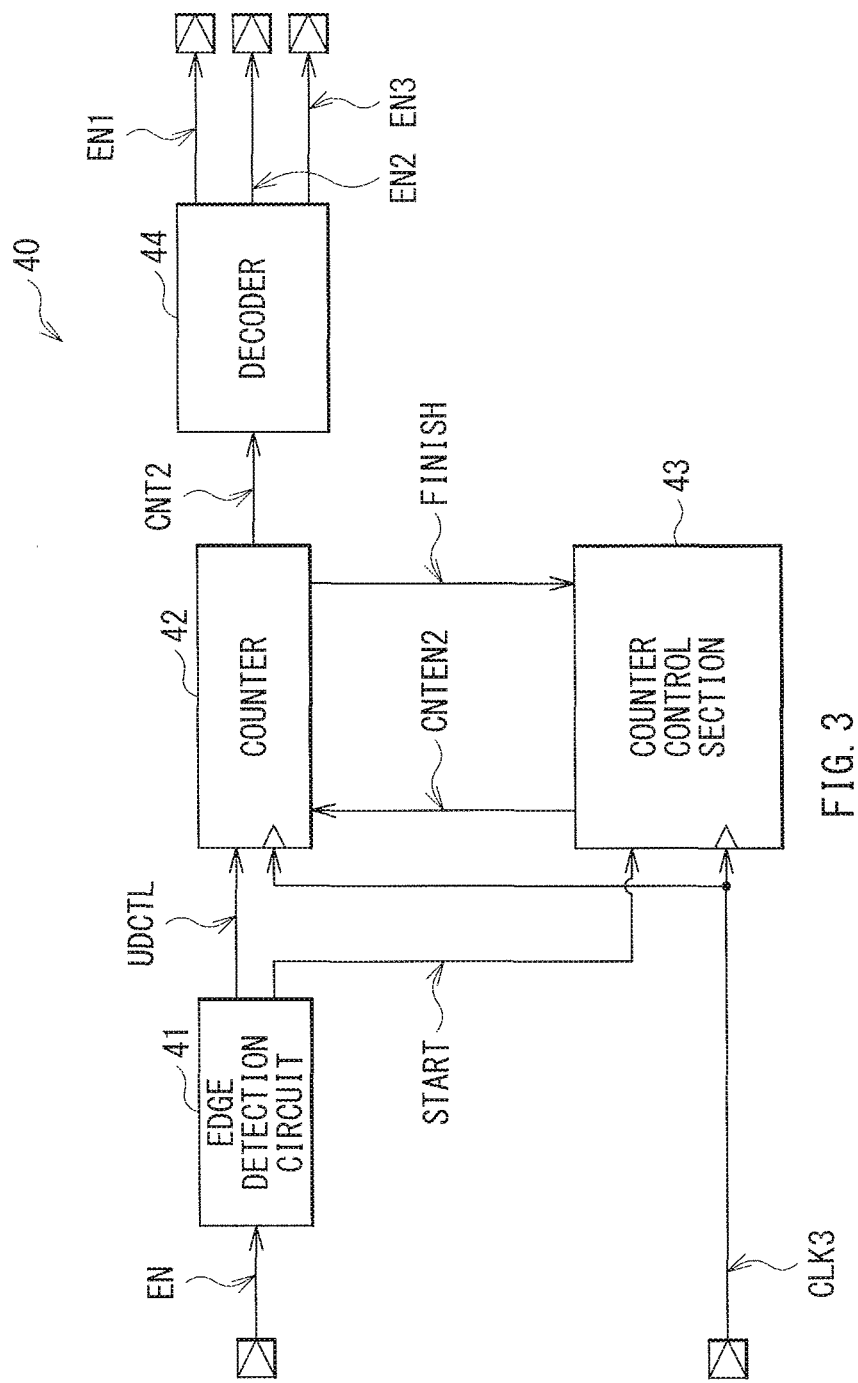
FIG. 3 is a block diagram illustrating a configuration example of a control signal generation section illustrated in FIG. 1.

FIG. 2 illustrates waveform examples of the activation signal EN, where (A) illustrates a waveform of the clock signal CLK1, and (B) to (D) each illustrate a waveform of the activation signal EN. (B) of FIG. 2 illustrates the waveform of the activation signal EN in a case (case C1) where the duty ratio control word DCTL indicates a certain value N1, (C) of FIG. 2 indicates the waveform of the activation signal EN in a case (case C2) where the duty ratio control word DCTL indicates a value N2 smaller than the value N1, and (D) of FIG. 2 illustrates the waveform of the activation signal EN in a case (case C3) where the duty ratio control word DCTL indicates a value N3 smaller than the value N2. As illustrated in FIG. 2, the activation signal generation section 32 generates the activation signal EN having the period same as a period T of the clock signal CLK1. At this time, the activation signal generation section 32 varies the duty ratio of the activation signal EN according to the duty ratio control word DCTL. Specifically, in the case C1, the activation signal generation section 32 generates the activation signal EN having a pulse of a pulse wide W1 ((B)

of FIG. 2), in the case C2, the activation signal generation section 32 generates the activation signal EN having a pulse of a pulse width W2 larger than the pulse width W1 ((C) of FIG. 3), and in the case C3, the activation signal generation section 32 generates the activation signal EN having a pulse of a pulse width W3 larger than the pulse width W2 ((D) of FIG. 2). In other words, the activation signal generation section 32 generates the activation signal EN with a small duty ratio when the value indicated by the duty ratio control word DCTL is large, and generates the activation signal EN with a large duty ratio when the value indicated by the duty ratio control word DCTL is small.

In this way, the activation signal generation section 32 generates the activation signal EN having the duty ratio corresponding to the duty ratio control word DCTL. Specifically, in the receiver 1, the duty ratio of the activation signal EN is controlled by the operation frequency of the receiving section 20. As a result, as will be described later, it is possible to reduce the consumed power while maintaining performance of the circuit of the receiving section 20 in the receiver 1.

The control signal generation section 40 generates the control signals EN1 to EN3, based on the activation signal EN and the clock signal CLK3.

FIG. 3 illustrates a configuration example of the control signal generation section 40. The control signal generation section 40 includes an edge detection circuit 41, a counter 42, a counter control section 43, and a decoder 44.

The edge detection circuit 41 detects a rising edge and a falling edge of the activation signal EN, and outputs the detection result as an up-down control signal UDCTL as well as activates a control signal START during a predetermined period.

The counter 42 counts up or counts down the pulses of the clock signal CLK3, based on the up-down control signal UDCTL, a counter activation signal CNTEN2, and a control signal FINISH, and outputs a count value CNT2. Specifically, as will be described later, the counter 42 counts up or counts down the pulses of the clock signal CLK3 according to the up-down control signal UDCTL during a period when the counter activation signal CNTEN2 is active. At this time, in the case where the up-down control signal UDCTL indicates that the rising edge is detected by the edge detection circuit 41, the counter 42 counts up the pulses of the clock signal CLK3, and activates the control signal FINISH when the count value CNT2 becomes a predetermined value. In addition, in the case where the up-down control signal UDCTL indicates that the falling edge is detected by the edge detection circuit 41, the counter 42 counts down the pulses of the clock signal CLK3, and activates the control signal FINISH when the count value CNT2 becomes the predetermined value.

The counter control section 43 controls the counter 42. Specifically, the counter control section 43 generates the counter activation signal CNTEN2, based on the clock signal CLK3 and the control signals START and FINISH, and controls the counter 42 through the signal.

As will be described later, the decoder 44 generates the control signals EN1 to EN3, based on the count value CNT2.

With this configuration, as will be described below, the control signal generation section 40 generates the control signals EN1 to EN3 different in transition timing from one another, based on the activation signal EN.

Figure 4:
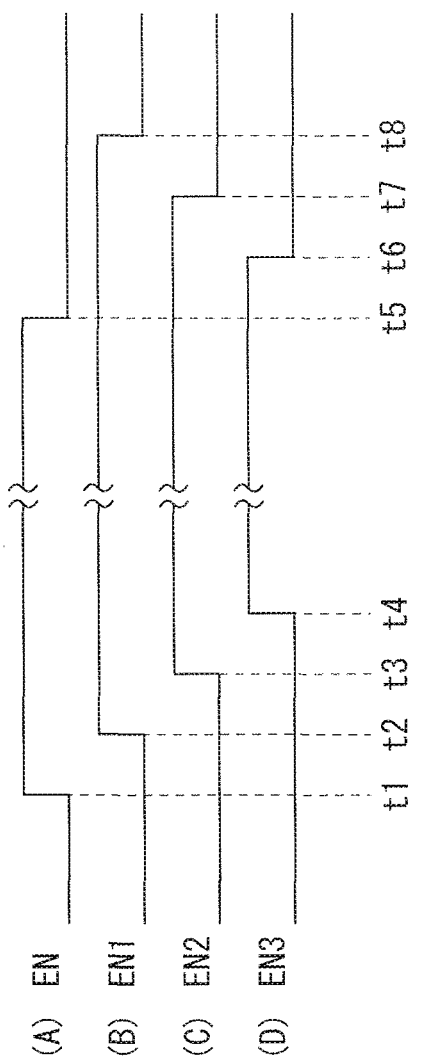
FIG. 4 is a timing waveform chart illustrating an example of a control signal illustrated in FIG. 3.

FIG. 4 illustrates waveform examples of the control signals EN1 to EN3, where (A) illustrates a waveform of the activation signal EN, and (B) to (D) illustrate waveforms of the control signals EN1 to EN3, respectively. After the activation signal EN becomes active at a timing t1, the control signal generation section 40 sequentially activates the control signals EN1 to EN3 in this order at timings t2 to t4. In addition, after the activation signal EN becomes inactive at a timintt5, the control signal generation section 40 sequentially inactivates the control signals EN3 to EN1 in this order at timings t6 to t8.

As a result, in the receiver 1, at the time of activation in the intermittent operation, the circuit block 21 that is controlled by the control signal EN1 is first activated to generate the signal S21, the circuit block 22 that is controlled by the control signal EN2 is then activated to generate the signal S22, and then, the circuit block 23 that is controlled by the control signal EN3 is activated. Further, at the time of operation stop, the circuit block 23 that is controlled by the control signal EN3 first stops operation, the circuit block 22 that is controlled by the control signal EN2 then stops operation, and then, the circuit block 21 that is controlled by the control signal EN1 stops operation.

Here, the activation signal generation section 32 corresponds to a specific but non-limiting example of "first signal generation section" in the disclosure. The control signal generation section 40 corresponds to a specific but non-limiting example of "second signal generation section" in the disclosure. The circuit blocks 21 to 23 correspond to a specific but non-limiting example of "first processing section" in the disclosure. The receiving section 20 corresponds to a specific but non-limiting example of "second processing section" in the disclosure. The clock signal CLK1 corresponds to a specific but non-limiting example of "first clock signal" in the disclosure. The clock signal CLK2 corresponds to a specific but non-limiting example of "second clock signal" in the disclosure. The clock signal CLK3 corresponds to a specific but non-limiting example of "third clock signal" in the disclosure.

(Operation and Function)

Subsequently, operation and a function of the receiver 1 according to the present embodiment will be described.

(General Operation Outline)

First, with reference to FIG. 1, general operation outline of the receiver 1 is described. The power circuit 10 supplies the power voltage VDD to each of the circuits in the receiver 1. The circuit blocks 21 to 23 receive the supply of the power voltage VDD from the power circuit 10 to perform the intermittent operation, based on the control signal EN1 to EN3, respectively. The receiving section 20 generates the baseband signal Sbb, based on the signal Srf supplied from the receiving antenna. The operation frequency detection section 24 of the receiving section 20 detects the operation frequency of the receiving section 20, and generates the duty ratio control word DCTL, based on the detection result. The clock signal generation section 31 of the intermittent operation control section 30 generates the clock signals CLK1 to CLK3. The activation signal generation section 32 generates the activation signal EN, based on the duty ratio control word DCTL and the clock signals CLK1 and CLK2. The control signal generation section 40 generates the control signals EN1 to EN3, based on the activation signal EN and the clock signal CLK3.

(Control Signal Generation Section 40)

The control signal generation section 40 generates the control signals EN1 to EN3 different in transition timing from one another, based on the activation signal EN. The operation thereof will be described in detail below.

Figure 5:
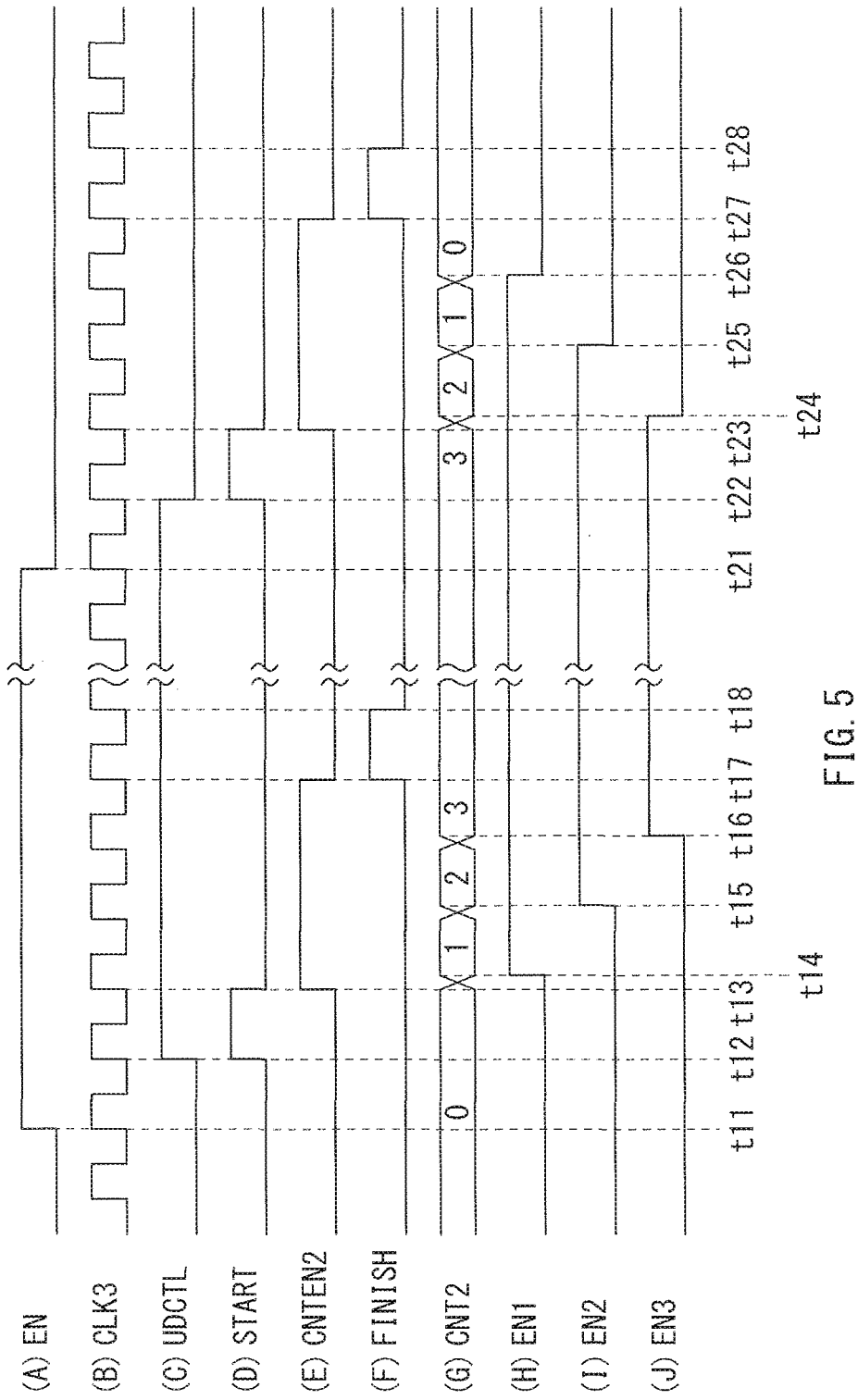
FIG. 5 is a timing waveform chart illustrating an operation example of the control signal generation section illustrated in FIG. 3.

FIG. 5 is a timing waveform chart of the operation of the control signal generation section 40, where (A) illustrates a waveform of the activation signal EN, (B) illustrates a waveform of the clock signal CLK3, (C) illustrates a waveform of the up-down control signal UDCTL, (D) illustrates a waveform of the control signal START, (E) illustrates a waveform of the counter activation signal CNTEN2, (F) illustrates a waveform of the control signal FINISH, (G) illustrates the count value CNT2, and (H) to (J) illustrate waveforms of the control signals EN1 to EN3, respectively. In this example, in the activation signal EN, the control signals START and FINISH, the counter activation signal CNTEN2, and the control signals EN1 to EN3, a high level indicates active and a low level indicates inactive. In addition, in (G) of FIG. 5, the count value CNT2 is illustrated by a number.

First, the activation signal EN changes from the low level to the high level at a timing t11 ((A) of FIG. 5). In response thereto, the edge detection circuit 41 detects a rising edge of the activation signal EN, changes the up-down control signal UDCTL from the low level to the high level at a timing t12 ((C) of FIG. 5), and instructs the counter 42 to perform count-up. In addition, the edge detection circuit 41 changes the control signal START from the low level to the high level at the same time ((D) of FIG. 5). In response thereto, the counter control section 43 changes the counter activation signal CNTEN2 from the low level to the high level at a timing t13 ((E) of FIG. 5), and instructs the counter 42 to count up the pulses of the clock signal CLK3. Then, the edge detection circuit 41 changes the control signal START from the high level to the low level at the timing t13 ((D) of FIG. 5).

The counter 42 counts up the pulses of the clock signal CLK3 during a period from the timing t13 to a timing t17 in which the counter activation signal CNTEN2 is active ((G) of FIG. 5), and in response to the count value CNT2, the decoder 44 generates the control signals EN1 to EN3 ((H) to (J) of FIG. 5). Specifically, at the timing t14, the counter 42 changes the count value CNT2 from "0" to "1", and the decoder 44 changes the control signal EN1 from the low level to the high level. Then, at the timing t15, the counter 42 changes the count value CNT2 from "1" to "2", and the decoder 44 changes the control signal EN2 from the low level to the high level. Then, at the timing t16, the counter 42 changes the count value CNT2 from "2" to "3", and the decoder 44 changes the control signal EN3 from the low level to the high level.

Next, the counter 42 changes the control signal FINISH from the low level to the high level at the timing t17 ((F) of FIG. 5). Specifically, since the count value CNT2 becomes a predetermined value "3", the counter 42 activates the control signal FINISH. In response thereto, the counter control section 43 changes the counter activation signal CNTEN2 from the high level to the low level at the timing t17 ((E) of FIG. 5). As a result, the counter 42 stops the count-up ((G) of FIG. 5). Then, the counter 42 changes the control signal FINISH from the high level to the low level at a timing t18 ((F) of FIG. 5).

Some time after that, the activation signal EN changes from the high level to the low level at a timing t21 ((A) of FIG. 5). In response thereto, the edge detection circuit 41 detects the falling edge of the activation signal EN, changes the up-down control signal UDCTL from the high level to the low level at a timing t22 ((C) of FIG. 5), and instructs the counter 42 to perform count-down. Moreover, the edge detection circuit 41 changes the control signal START from the low level to the high level at the same time ((D) of FIG. 5). In response thereto, at a timing t23, the counter control section 43 changes the counter activation signal CNTEN2 from the low level to the high level ((E) of FIG. 5), and instructs the counter 42 to count down the pulses of the clock signal CLK3. Then, the edge detection circuit 41 changes the control signal START from the high level to the low level at the timing t23 ((D) of FIG. 5).

The counter 42 counts down the pulses of the clock signal CLK3 during a period from the timing t23 to a timing t27 in which the counter activation signal CNTEN2 is active ((G) of FIG. 5), and in response to the count value CNT2, the decoder 44 generates the control signals EN1 to EN3 ((H) to (J) of FIG. 5). Specifically, at the timing t24, the counter 42 changes the count value CNT2 from "3" to "2", and the decoder 44 changes the control signal EN3 from the high level to the low level. Then, at the timing t25, the counter 42 changes the count value CNT2 from "2" to "1", and the decoder 44 changes the control signal EN2 from the high level to the low level. Then, at the timing t26, the counter 42 changes the count value CNT2 from "1" to "0", and the decoder 44 changes the control signal EN1 from the high level to the low level.

Next, at the timing t27, the counter 42 changes the control signal FINISH from the low level to the high level ((F) of FIG. 5). Specifically, since the count value CNT2 becomes a predetermined value "0", the counter 42 activates the control signal FINISH. In response thereto, the counter control section 43 changes the counter activation signal CNTEN2 from the high level to the low level at the timing t27 ((E) of FIG. 5). Accordingly, the counter 42 stops the count-down ((G) of FIG. 5). Then, at the timing t28, the counter 42 changes the control signal FINISH from the high level to the low level ((F) of FIG. 5).

In this way, the control signal generation section 40 sequentially activates the control signals EN1 to EN3 at the timings t14 to t16. As a result, in the receiver 1, the circuit block 21 that is controlled by the control signal EN1 is first activated to generate the signal S21, the circuit block 22 that is controlled by the control signal EN2 is then activated to generate the signal S22, and then the circuit block 23 that is controlled by the control signal EN3 is activated. In addition, the control signal generation section 40 sequentially inactivates the control signals EN3 to EN1 in this order at the timings t24 to t26. As a result, in the receiver 1, the circuit block 23 that is controlled by the control signal EN3 first stops operation, the circuit block 22 that is controlled by the control signal EN2 then stops operation, and the circuit block 21 that is controlled by the control signal EN1 then stops operation.

As described above, in the receiver 1, the circuit block 21 constantly operates during the operation period of the circuit block 22, and the circuit block 22 constantly operates during the operation period of the circuit block 23. Therefore, the signal S21 is stably supplied to the circuit block 22, and the signal S22 is stably supplied to the circuit block 23. As a result, in the receiver 1, it is possible to reduce possibility that unexpected incident such as transitional increase of consumed current occurs. In other words, for example, if there is a period when the circuit block 21 does not operate during the operation period of the circuit block 22, there is a possibility that the signal S21 is not stably supplied to the circuit block 22 during the period. Accordingly, for example, the operation of the circuit block 22 may become unstable, which may cause unexpected incident such as transitional increase of the consumed current. On the other hand, in the receiver 1, the circuit block 21 constantly operates during the operation period of the circuit block 22, and the circuit block 22 constantly operates during the operation period of the circuit block 23. Therefore, it is possible to reduce possibility that unexpected incident occurs.

Moreover, in the receiver 1, the circuit blocks 21 to 23 are sequentially controlled based on the control signals EN1 to EN3 as described above. Therefore, as will be described below, it is possible to reduce fluctuation of the power voltage VDD.

Figure 6:
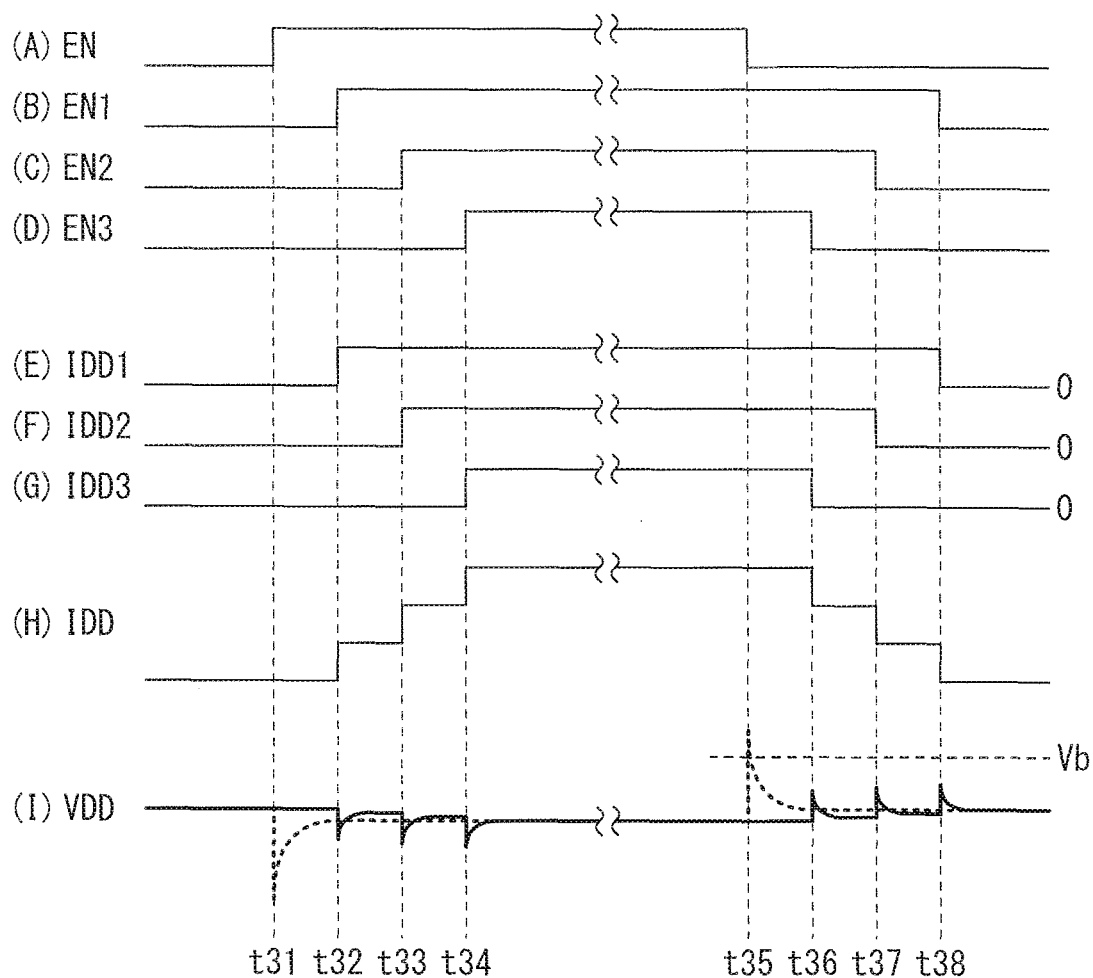
FIG. 6 is a timing waveform chart illustrating an operation example of the receiver illustrated in FIG. 1.

FIG. 6 is a timing waveform chart in the intermittent operation, where (A) illustrates a waveform of the activation signal EN, (B) to (D) illustrate waveforms of the control signals EN1 to EN3, respectively, (E) to (G) illustrate waveforms of currents IDD1 to IDD3 flowing through power terminals of the circuit blocks 21 to 23, respectively, (H) illustrates a waveform of a power current IDD flowing through the power circuit 10, and (I) illustrates a waveform of the power voltage VDD.

When the control signal EN1 becomes active at a timing t32 ((B) of FIG. 6), the circuit block 21 is activated, and the current IDD1 flows through the power terminal of the circuit block 21 ((E) of FIG. 6). Therefore, the power current IDD flowing through the power circuit 10 increases by the current amount of the circuit block 21 ((H) of FIG. 6). At this time, the power voltage VDD transitionally lowers at the timing t32, and then converges toward a voltage slightly lower than a voltage immediately before the timing t32.

Likewise, when the control signal EN2 becomes active at a timing t33 ((C) of FIG. 6), the circuit block 22 is activated and the current IDD2 flows through the power terminal of the circuit block 22 ((F) of FIG. 6), and the power current IDD increases by the current amount of the circuit block 22 ((H) of FIG. 6). At this time, the power voltage VDD transitionally lowers at the timing t33, and then converges toward a voltage slightly lower than a voltage immediately before the timing t33. Moreover, when the control signal EN3 becomes active at a timing t34 ((D) of FIG. 6), the circuit block 23 is activated and the current IDD3 flows through the power terminal of the circuit block 23 ((G) of FIG. 6), and the power current IDD increases by the current amount of the circuit block 23 ((H) of FIG. 6). At this time, the power voltage VDD transitionally lowers at the timing t34, and then converges toward a voltage slightly lower than a voltage immediately before the timing t34.

On the other hand, when the control signal EN3 becomes inactive at a timing t36 ((D) of FIG. 6), the circuit block 23 stops operation and the current IDD3 at the power terminal of the circuit block 23 decreases ((G) of FIG. 6). Accordingly, the power current IDD flowing through the power circuit 10 decreases by the current amount of the circuit block 23 ((H) of FIG. 6). At this time, the power voltage VDD transitionally increases at the timing t36, and then converges toward a voltage slightly higher than a voltage immediately before the timing t36.

Likewise, when the control signal EN2 becomes inactive at a timing t37 ((C) of FIG. 6), the circuit block 22 stops operation and the current IDD2 decreases ((F) of FIG. 6), and the power current IDD decreases by the current amount ((H) of FIG. 6). At this time, the power voltage VDD transitionally increases at the timing t37, and then converges toward a voltage slightly higher than a voltage immediately before the timing t37. In addition, when the control signal EN1 becomes inactive at a timing t38 ((B) of FIG. 6), the circuit block 21 stops operation and the current IDD1 decreases ((E) of FIG. 6), and the power current IDD decreases by the current amount ((H) of FIG. 6). At this time, the power voltage VDD transitionally increases at the timing t38, and then converges toward a voltage slightly higher than a voltage immediately before the timing t38.

In this way, the power voltage VDD varies in response to the transition of the control signals EN1 to EN3. At this time, in the receiver 1, the intermittent operation of the circuit blocks 21 to 23 are controlled based on the control signals EN1 to EN3, respectively. Therefore, it is possible to suppress variation of the power voltage VDD. Specifically, for example, when the intermittent operation of the circuit blocks 21 to 23 are controlled based on the activation signal EN in place of the control signals EN1 to En3, the power voltage VDD may transitionally vary largely at the transition timings t31 and t35 of the activation signal EN as illustrated by a dashed line in (I) of FIG. 6. In such a case, other circuits supplied with the power voltage VDD from the power circuit 10 may perform malfunction. In addition, as illustrated in the vicinity of the timing t35, when the power voltage VDD increases and exceeds a withstand voltage Vb of a transistor and the like, the circuit may be destroyed or reliability of the circuit may be lowered. On the other hand, in the receiver 1, the intermittent operation of the circuit blocks 21 to 23 are controlled based on the control signals EN1 to EN3, respectively. Therefore, it is possible to suppress variation of the power voltage VDD. As a result, it is possible to reduce possibility that the circuit performs malfunction, and to reduce possibility that the circuit is destroyed or the reliability of the circuit is lowered.

In addition, in the receiver 1, the variation of the power voltage VDD is allowed to be suppressed in this way. Therefore, it is possible to decrease a capacitance value of a capacitor for stabilizing the power voltage VDD. As a result, in particular, when the receiver 1 is configured of one chip, it is possible to reduce a circuit area.

(Activation Signal Generation Section 32)

The activation signal generation section 32 generates the activation signal EN having a duty ratio that corresponds to a value indicated by the duty ratio control word DCTL, based on the duty ratio control word DCTL. The operation thereof will be described in detail below.

Figure 7:
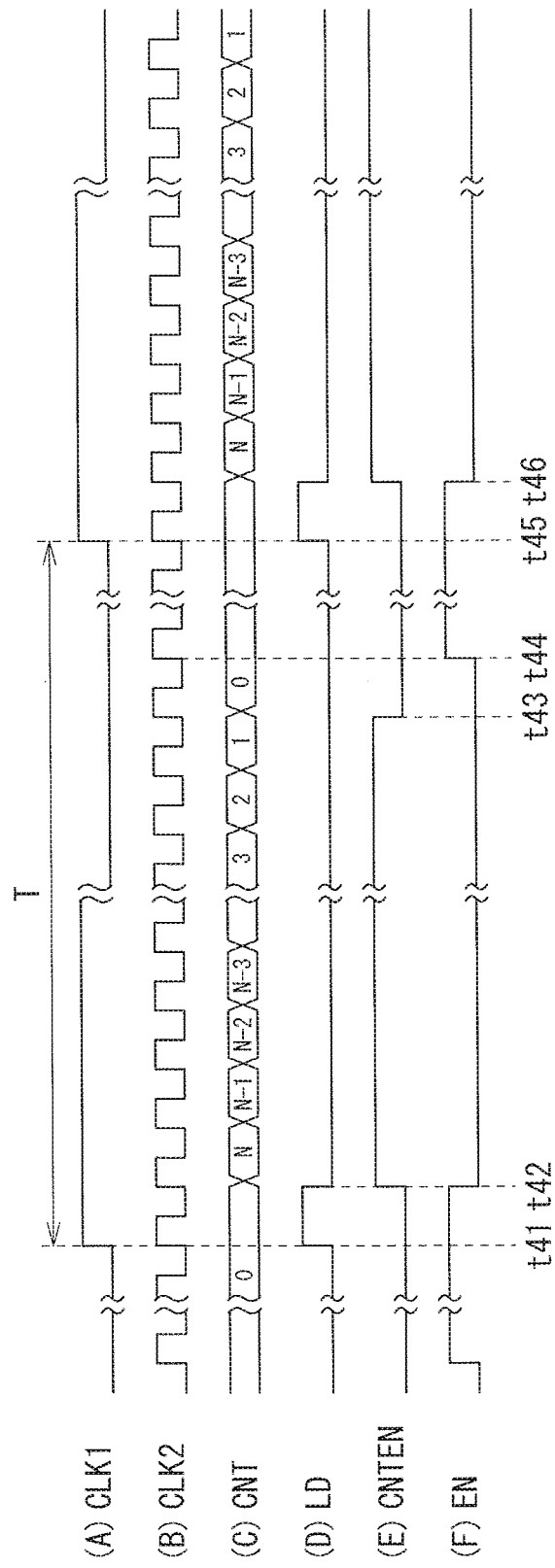
FIG. 7 is a timing waveform chart illustrating an operation example of an activation signal generation section illustrated in FIG. 1.

FIG. 7 is a timing waveform chart of the operation of the activation signal generation section 32, where (A) illustrates a waveform of the clock signal CLK1, (B) illustrates a waveform of the clock signal CLK2, (C) illustrates the count value CNT, (D) illustrates a waveform of the load signal LD, (E) illustrates a waveform of the counter activation signal CNTEN, and (F) illustrates a waveform of the activation signal EN. In this example, in the load signal LD, the counter activation signal CNTEN, and the activation signal EN, the high level indicates active, and the low level indicates inactive. In addition, in (C) of FIG. 7, the count value CNT is illustrated by a number.

First, at a timing t41, the clock signal CLK1 changes from the low level to the high level ((A) of FIG. 7). In response thereto, the counter control section 34 changes the load signal LD from the low level to the high level ((D) of FIG. 7), and instructs the counter 33 to take in a value indicated by the duty ratio control word DCTL, as an initial value (N in this example). Then, at a timing t42, the counter control section 34 changes the load signal LD from the high level to the low level as well as changes the counter activation signal CNTEN from the low level to the high level ((E) of FIG. 7), and instructs the counter 33 to count down the pulses of the clock signal CLK2 from the value N. Further, the counter control section 34 changes the activation signal EN from the high level to the low level at the timing t42 ((F) of FIG. 7).

The counter 33 counts down the pulses of the clock signal CLK2 from the value N during a period from the timing t42 to the timing t43 in which the counter activation signal CNTEN is active ((C) of FIG. 7). In this example, at a certain timing in the period from the timing t42 to the timing t43, the clock signal CLK1 changes from the high level to the low level ((A) of FIG. 7). Then, the counter control section 34 changes the counter activation signal CNTEN from the high level to the low level at the timing t43 at which the count value CNT becomes "0" ((E) of FIG. 7), and changes the activation signal EN from the low level to the high level at a timing t44 ((F) of FIG. 7).

Next, at a timing t45, the clock signal CLK1 changes from the low level to the high level ((A) of FIG. 7). Then, the counter control section 34 changes the activation signal EN from the high level to the low level at a timing t46 ((F) of FIG. 7).

As described above, the activation signal generation section 32 changes the activation signal EN to the low level in duration of the length corresponding to the value N indicated by the duty ratio control word DCTL in the duration of the period T, and changes the activation signal EN to the high level in other duration. In this way, the activation signal generation section 32 generates the activation signal EN having the duty ratio corresponding to the value N that is indicated by the duty ratio control word DCTL.

Figure 8:
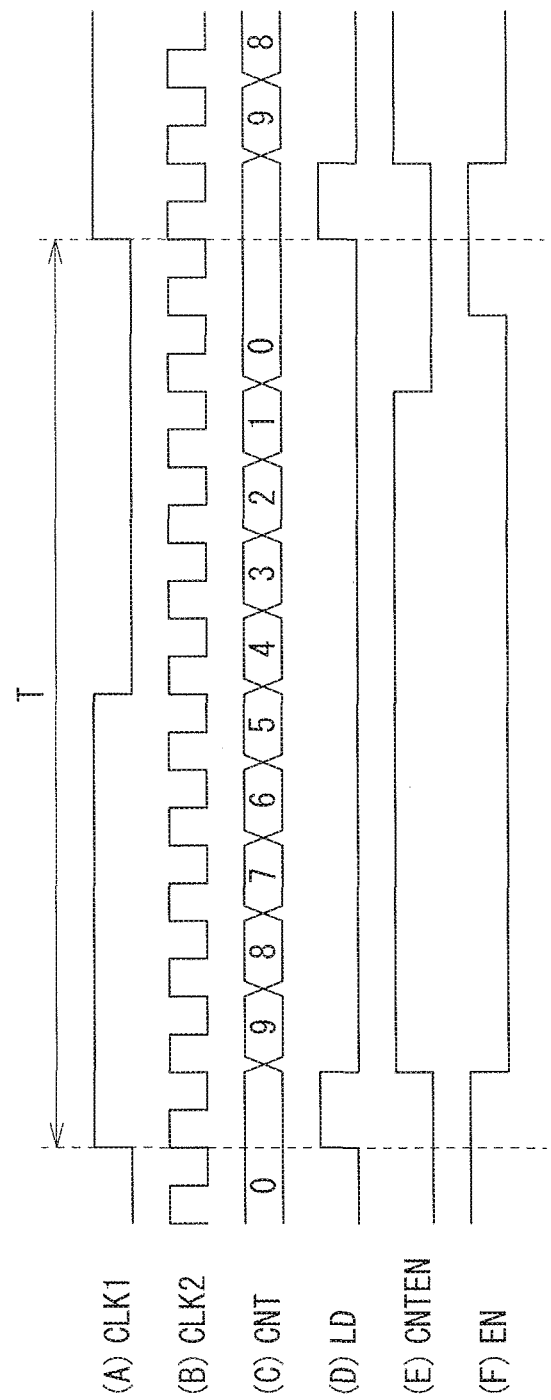
FIG. 8 is a timing waveform chart illustrating another operation example of the activation signal generation section illustrated in FIG. 1.
Figure 9:
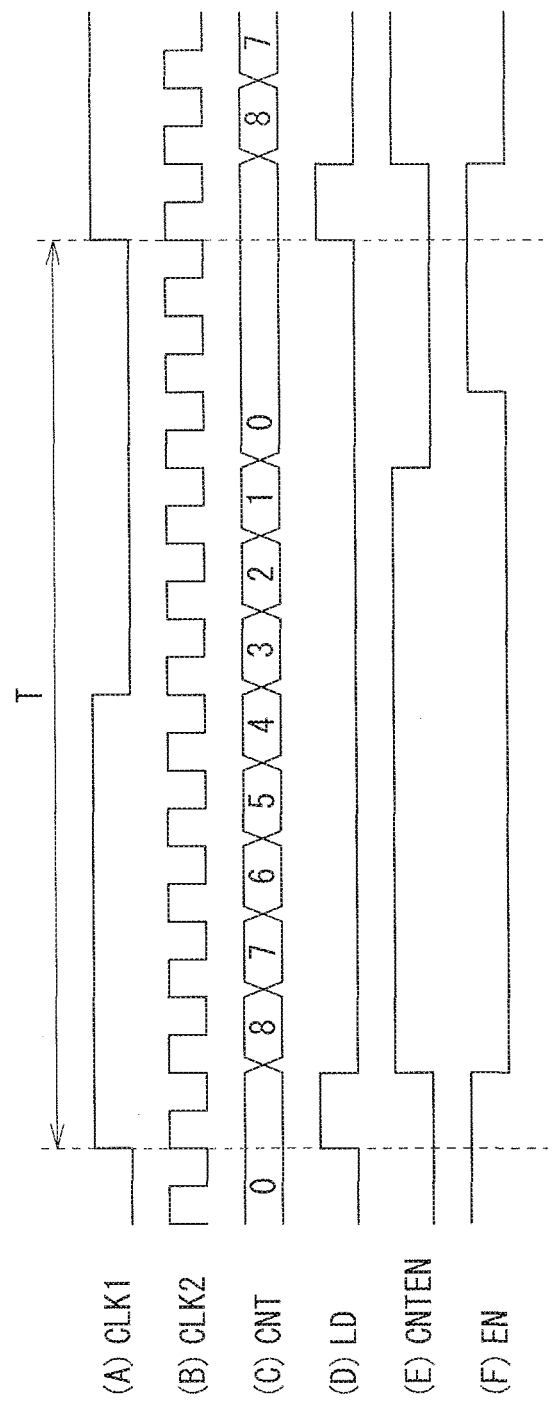
FIG. 9 is a timing waveform chart illustrating still another operation example of the activation signal generation section illustrated in FIG. 1.
Figure 10:
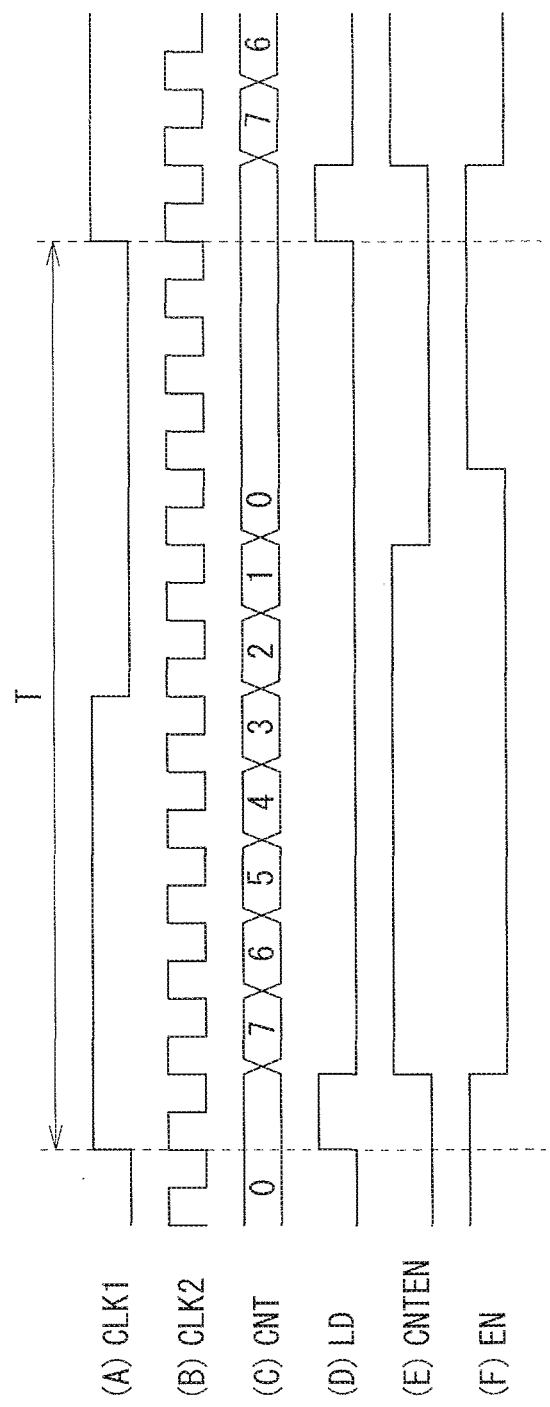
FIG. 10 is a timing waveform chart illustrating still another operation example of the activation signal generation section illustrated in FIG. 1.

FIGS. 8 to 10 each illustrate operation when the value N indicated by the duty ratio control word DCTL is varied. In this example, for convenience of description, the frequency of the clock signal CLK2 is set to 12 times of the frequency of the clock signal CLK1. FIG. 8 illustrates a case where the value N is set to "9", FIG. 9 illustrates a case where the value N is set to "8", and FIG. 10 illustrates a case where the value N is set to "7".

In the case where the value N is set to "9", the counter 33 counts down from "9" ((C) of FIG. 8), in the case where the value N is set to "8", the counter 33 counts down from "8" ((C) of FIG. 9), and in the case where the value N is set to "7", the counter 33 counts down from "7" ((C) of FIG. 10). Accordingly, the duty ratio of the activation signal EN becomes small as the value N is larger, and becomes large as the value N is smaller.

In this way, in the receiver 1, the duty ratio of the activation signal EN is controlled based on the duty ratio control word DCTL. Further, the control signal generation section 40 generates the control signals EN1 to EN3 based on the activation signal EN as illustrated in FIG. 5 and the like. In other words, the duty ratio of each of the control signals EN1 to EN3 is also controlled based on the duty ratio control word DCTL. As a result, as will be described below, it is possible to reduce consumed power while maintaining the performance of the circuit.

Figure 11:
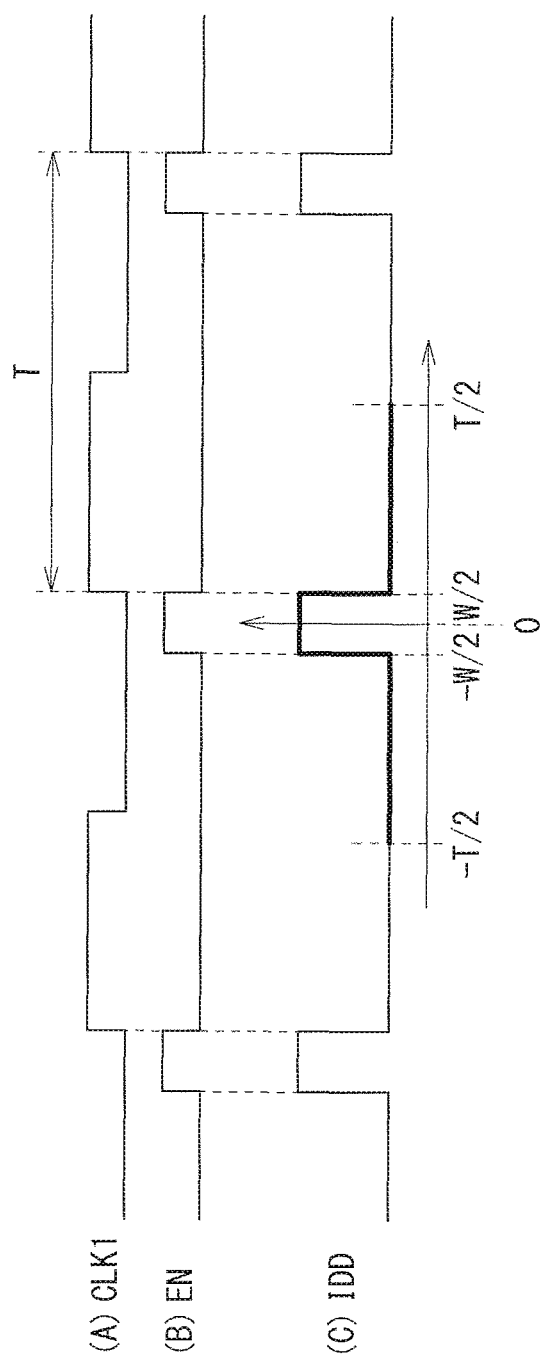
FIG. 11 is a timing waveform chart illustrating intermittent operation of a circuit block illustrated in FIG. 1.

FIG. 11 illustrates variation of the power current IDD by the intermittent operation, where (A) illustrates a waveform of the clock signal CLK1, (B) illustrates a waveform of the activation signal EN, and (C) illustrates a waveform of the power current IDD. Incidentally, in FIG. 11, the rising timing of the clock signal CLK1 and the falling timing of the activation signal EN are illustrated as the same timing. Specifically, as illustrated in FIG. 7 and the like, the rising timing of the clock signal CLK1 and the falling timing of the activation signal EN are slightly different from each other. However, the timing difference is sufficiently small as compared with the period T, and therefore, these timings are illustrated as the same timing. In addition, in FIG. 11, the rising timing of the activation signal EN and the increasing timing of the power current IDD are illustrated as the same timing. Specifically, as illustrated in FIG. 6 and the like, the power current IDD varies stepwisely after transition of the activation signal EN. However, the timing difference is sufficiently small as compared with the period T, and therefore, these timings are illustrated as the same timing. The same applies to the falling timing of the activation signal EN and the decreasing timing of the power current IDD.

As illustrated in FIG. 11, the circuit blocks 21 to 23 perform the intermittent operation through the control signals EN1 to EN3, respectively, based on the activation signal EN. The waveform of the power current IDD at this time is characterized by a function f(t) that has a pulse of a width W and is defined by a range of $-T/2 < t < T/2$.

[Numerical Expression 1]

$$f(t) = \begin{cases} 1 \left( -\frac{W}{2} < t < \frac{W}{2} \right) \\ 0 \left( -\frac{T}{2} < t < \frac{W}{2}, \frac{W}{2} < t < \frac{T}{2} \right) \end{cases} \quad (1)$$

Specifically, the waveform of the power current IDD is represented by repeating the function f(t) with the period T. When the function f(t) is developed by Fourier series, Fourier coefficient $a_k$ is represented by the following expression.

[Numerical Expression 2]

$$a_k = \frac{2}{T} \cdot \frac{\sin \frac{k \cdot W \cdot \pi}{T}}{\frac{k \cdot W \cdot \pi}{T}} = \frac{2}{T} \cdot \mathrm{sinc} \frac{k \cdot W \cdot \pi}{T} \quad (2)$$

In this way, changing the pulse width W makes it possible to change Fourier coefficient $a_k$. As a result, as will be described below, a frequency at which notch occurs in spectrum is allowed to be changed.

Figure 12A:
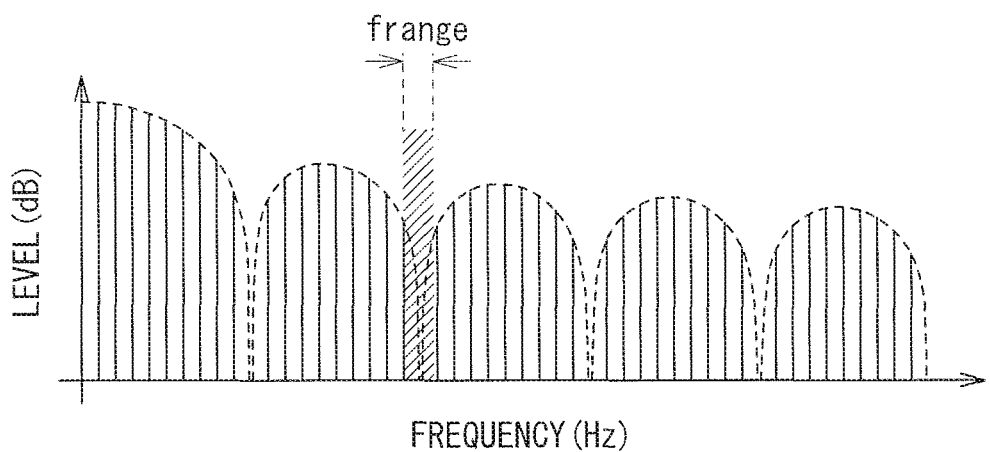
FIG. 12A is an explanatory diagram illustrating spectrum in the intermittent operation.
Figure 12B:
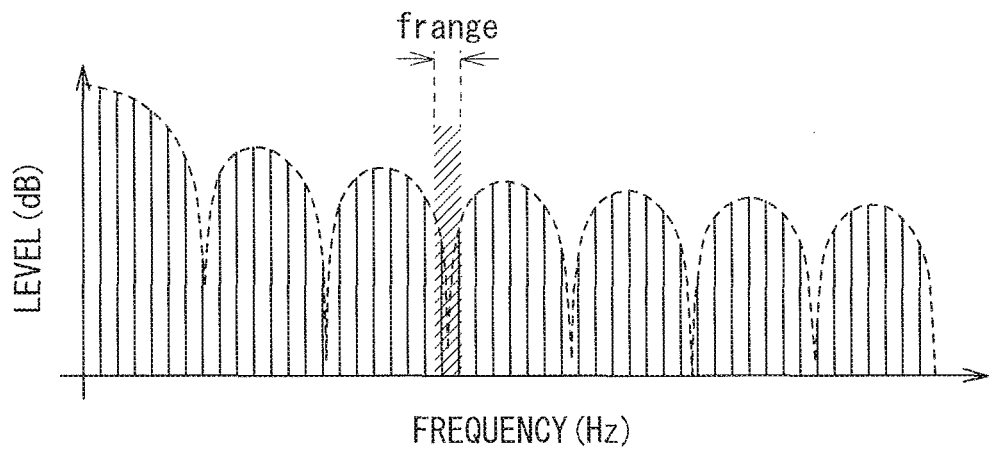
FIG. 12B is another explanatory diagram illustrating spectrum in the intermittent operation.
Figure 12C:
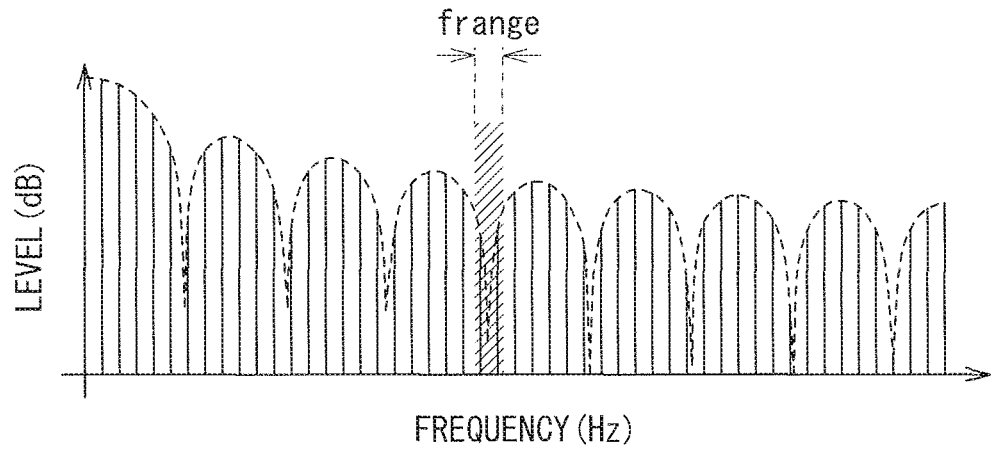
FIG. 12C is still another explanatory diagram illustrating spectrum in the intermittent operation.

FIGS. 12A to 12C each illustrate spectrum of the power current IDD, where FIG. 12A illustrates the case C1 (the pulse width W1), FIG. 12B illustrates the case C2 (the pulse width W2), and FIG. 12C illustrates the case C3 (the pulse width W3) illustrated in FIG. 2. In this way, changing the pulse width W makes it possible to change the shape of the spectrum. Therefore, as illustrated in FIGS. 12A to 12C, the pulse width W is changed such that the notch of the spectrum corresponds to the operation frequency range frange of the receiving section 20, which makes it possible to reduce influence of the intermittent operation to the operation of the receiving section 20.

In the receiver 1, the operation frequency detection section 24 generates the duty ratio control word DCTL, based on the operation frequency of the receiving section 20, and the activation signal generation section 32 generates the activation signal EN having the duty ratio corresponding to the duty ratio control word DCTL, based on the duty ratio control word DCTL. Accordingly, in the receiver 1, the pulse width W (the duty ratio) is allowed to be changed so that the notch of the spectrum corresponds to the operation frequency range frange of the receiving section 20, and it is possible to reduce the consumed power while maintaining the performance of the receiving section 20.

(Effects)

As described above, in the present embodiment, the pulse width (the duty ratio) of the activation signal is configured to be variable. Therefore, it is possible to reduce consumed power while maintaining the performance of the receiving section.

In the present embodiment, the pulse width (the duty ratio) of the activation signal is changed based on the operation frequency of the receiving section. Therefore, it is possible to maintain the performance of the receiving section within a wide operation frequency range.

In the present embodiment, the circuit blocks 21 to 23 are controlled based on the control signals EN1 to EN3 that have the transition timings different from one another. Therefore, it is possible to suppress variation of the power voltage. Accordingly, it is possible to reduce possibility that the circuit performs malfunction and to reduce possibility that the circuit is destroyed or the reliability of the circuit is lowered. Moreover, since the variation of the power voltage VDD is allowed to be suppressed in this way, it is possible to decrease the capacitance value of the capacitor for stabilizing the power voltage VDD, and to suppress the circuit area.

In the present embodiment, the circuit block 21 constantly operates during the operation period of the circuit block 22, and the circuit block 22 constantly operates during the operation period of the circuit block 23. Therefore, it is possible to reduce possibility that unexpected incident Occurs.

(Modification 1)

In the above-described embodiment, as an example, the frequencies of the clock signals CLK1 to CLK3 are set to 8 MHz, 250 MHz, and 1 GHz, respectively. However, the frequencies are not limited thereto, and alternatively, for example, the frequencies are allowed to be freely set. For example, the period of the clock signal CLK3 corresponds to the difference between the transition timings of the control signals EN1 to EN3 as illustrated in FIG. 5 and the like. Therefore, the difference between the transition timings to be set may be studied and the frequency of the clock signal CLK3 may be set based on the study result. For example, the difference between the transition timings of the control signals EN1 to EN3 may be desirably determined by considering the time from activation of the circuit blocks 21 to 23 until the operation states of these circuits become stable. Specifically, for example, the difference between the transition timings of the control signals EN1 to EN3 may be determined based on the longest time until the operation state become stable among the circuit blocks 21 to 23. In addition, for example, the difference between the transition timings of the control signals EN1 and EN2 and the difference between the transition timings of the control signals EN2 and EN3 may be individually set, based on the time until the operation states of the respective circuit blocks 21 to 23 become stable. Moreover, for example, the circuit block 21 is first activated to monitor the signal S21, and the circuit block 22 may be activated after confirming that the circuit block 21 becomes stable.

(Modification 2)

In the above-described embodiment, as illustrated in FIG. 5, the transition timings of the control signals EN1 to EN3 are set to be different from one another by one period of the clock signal CLK3. However, this is not limitative. The present modification will be described in detail below.

Figure 13:
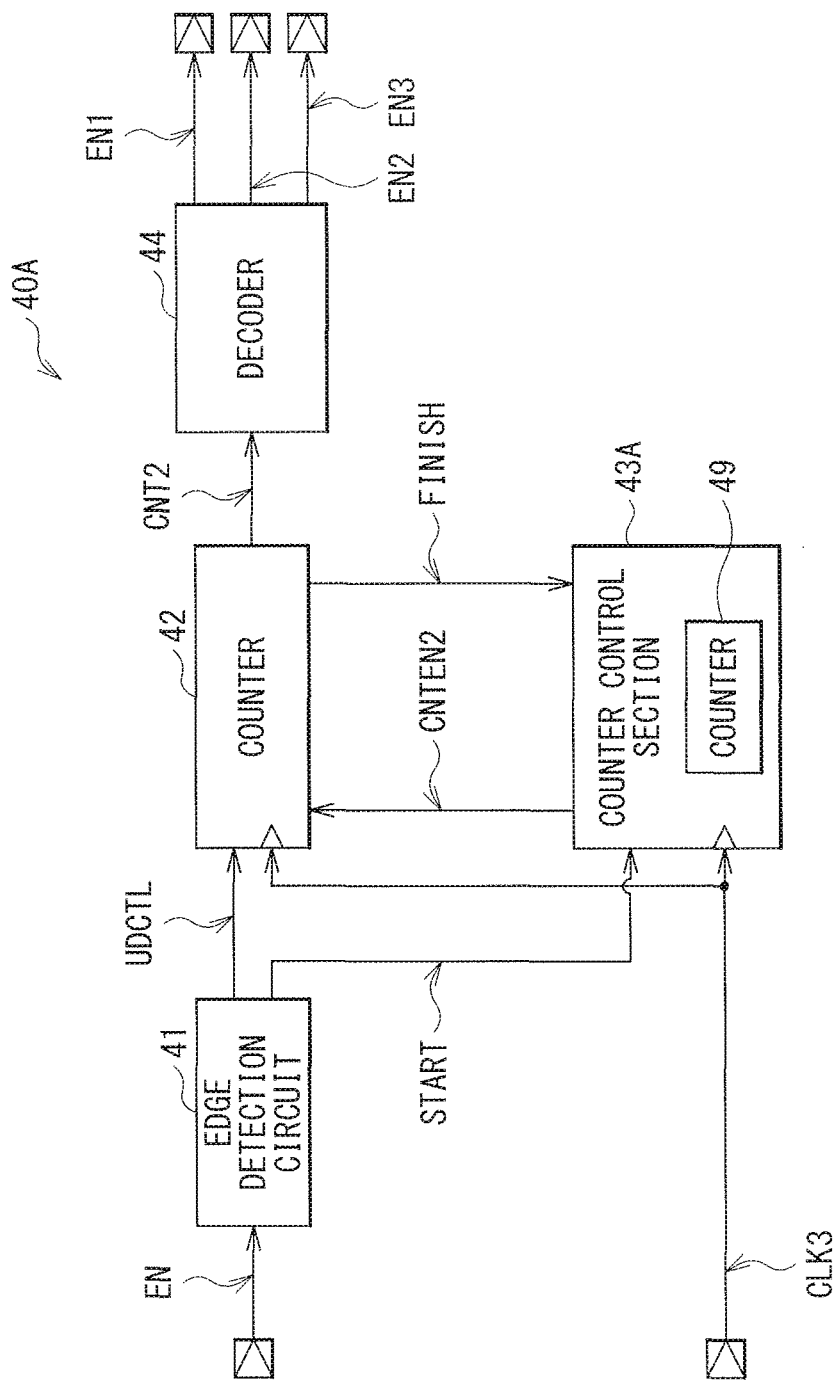
FIG. 13 is a block diagram illustrating a configuration example of a control signal generation section according to a modification.

FIG. 13 illustrates a configuration example of a control signal generation section 40A according to the present modification. The control signal generation section 40A has a counter control section 43A. The counter control section 43A has a counter 49 that counts the pulses of the clock signal CLK2. The control signal generation section 40A generates a counter activation signal CNTEN2, based on the count value of the counter 49. Accordingly, as will be described below, the control signal generation section 40A generates the control signals EN1 to NE3 whose transition timings are different from one another by a time corresponding to the count value of the counter 49.

Figure 14:
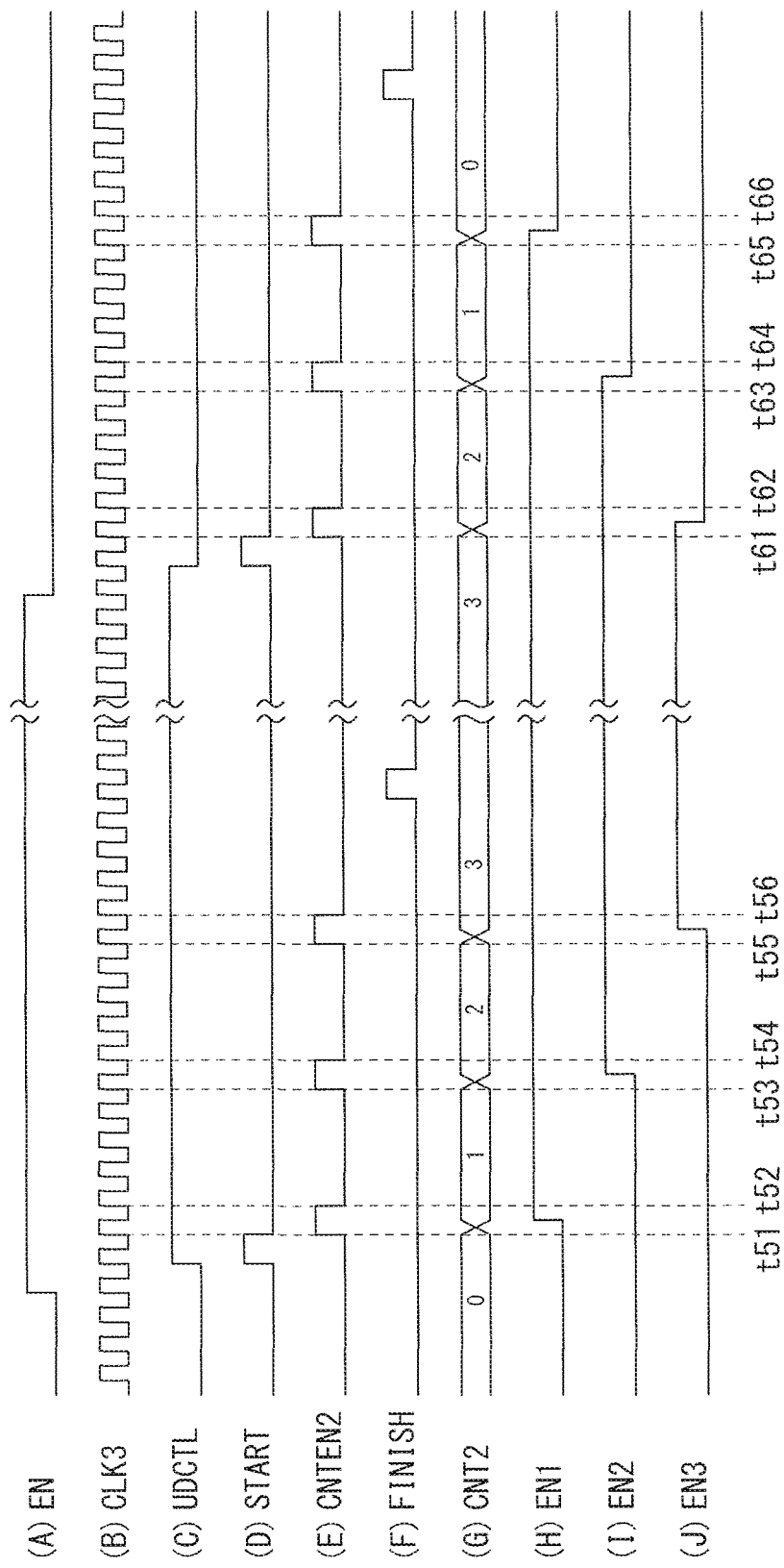
FIG. 14 is a timing waveform chart illustrating an operation example of the control signal generation section illustrated in FIG. 13.

FIG. 14 is a timing waveform chart of the operation of the control signal generation section 40A, where (A) illustrates a waveform of the activation signal EN, (B) illustrates a waveform of the clock signal CLK3, (C) illustrates a waveform of the up-down signal UDCTL, (D) illustrates a waveform of the control signal START, (E) illustrates a waveform of the counter activation signal CNTEN2, (F) illustrates a waveform of the control signal FINISH, (G) illustrates the count value CNT2, and (H) to (J) illustrate waveforms of the control signals EN1 to EN3, respectively.

In this example, after the activation signal EN becomes active, the counter control section 43A activates the counter control signal CNTEN2 during three periods, that is, a period from a timing t51 to a timing t52, a period from a timing t53 to a timing t54, and a period from a timing t55 to a timing t56. Specifically, as illustrated in FIG. 5, the counter control section 43 according to the above-described embodiment activates the counter control signal CNTEN2 during the period from the timing t13 to the timing t17, whereas the counter control section 43A according to the present modification activates the counter signal CNTEN2 during the three periods. More specifically, in this example, the counter control section 43A activates the counter control signal CNTEN2 by the duration of one period of the clock signal CLK3 once every time the counter 49 counts five pulses of the clock signal CLK3. The counter 42 counts up the pulses of the clock signal CLK3 during the three periods in which the counter activation signal CNTEN2 is active ((G) of FIG. 14), and in response to the count value CNT2, the decoder 44 activates the control signal EN1 to EN3 ((H) to (J) of FIG. 14).

Likewise, after the activation signal EN becomes inactive, the counter control section 43A activates the counter control signal CNTEN2 during three periods, that is, a period from a timing t61 to a timing t62, a period from a timing t63 to a timing t64, and a period from a timing t65 to a timing t66. The counter 42 counts down the pulses of the clock signal CLK3 during these three periods in which the counter activation signal CNTEN2 is active ((G) of FIG. 14), and in response to the count value CNT2, the decoder 44 inactivates the control signals EN1 to EN3 ((H) to (J) of FIG. 14).

With this configuration, the difference between the transition timings of the control signals EN1 to En3 are allowed to make large, and for example, the circuit block 22 may be activated after the operation state of the circuit block 21 is sufficiently stable, and the circuit block 23 may be activated after the operation state of the circuit block 22 is sufficiently stable.

Incidentally, in this example, the difference between the transition timings of the control signals EN1 and EN2 is equal to the difference between the transition timings of the control signals EN2 and EN3; however, this is not limitative, and may be different from each other. Accordingly, for example, in the case where the time until the operation state becomes stable in the respective circuit blocks 21 to 21 are different from one another, the circuit blocks are allowed to be activated promptly and are allowed to stop operation promptly.

(Modification 3)

Figure 15:
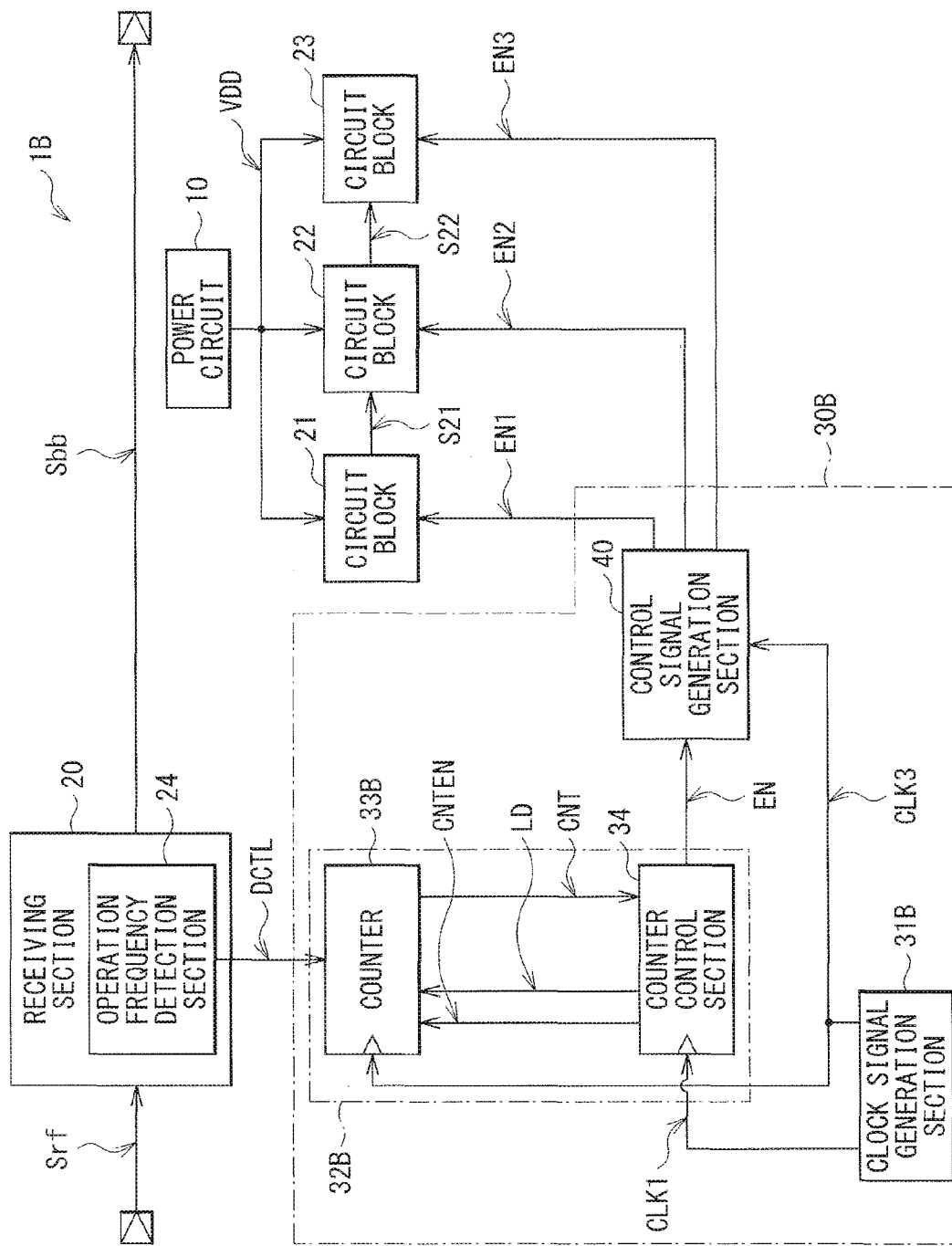
FIG. 15 is a block diagram illustrating a configuration example of a receiver according to a modification.

In the above-described embodiment, the clock signal generation section 31 generates the three clock signals CLK1 to CLK3; however, this is not limitative. Alternatively, for example, as with a receiver 1B illustrated in FIG. 15, a clock signal generation section 31B may generate two clock signals CLK1 and CLK3. The receiver 1B includes an intermittent operation control section 30B. The intermittent operation control section 30B includes the clock signal generation section 31B and an activation signal generation section 32B. The activation signal generation section 32B includes a counter 33B. Similarly to the counter 33 according to the above-described embodiment, the counter 33B counts down the pulses of the clock signal CLK3, based on the duty ratio control word DCTL, the load signal LD, and the counter activation signal CNTEN, and outputs the count value CNT. Since the counter 33B counts the pulses of the clock signal CLK3 having a frequency higher than that of the clock signal CLK2, the counter 33B is configured to counts larger number of pulses of the clock signal CLK3 than that of the counter 33. With this configuration, it is possible to decrease the number of clock signals, and to simplify the circuit configuration.

(Modification 4)

In the above-described embodiment, the control signals EN1 to EN3 are generated with use of the counter 42 and the like; however, the configuration is not limited thereto. Alternatively, for example, the control signals EN1 to EN3 may be generated with use of a delay circuit. Control signal generation sections 50 and 60 according to the present modification will be described below.

Figure 16:
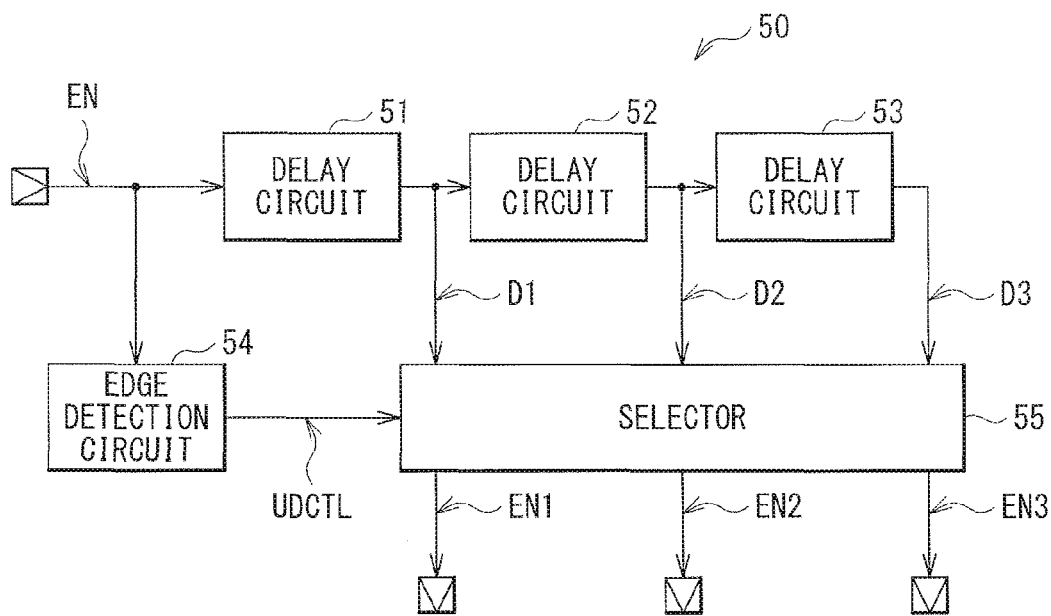
FIG. 16 is a block diagram illustrating a configuration example of a control signal generation section according to another modification.

FIG. 16 illustrates a configuration example of the control signal generation section 50 according to the present modification. The control signal generation section 50 includes delay circuits 51 to 53, an edge detection circuit 54, and a selector 55. The delay circuit 51 delays the activation signal EN by a predetermined time, and outputs the delayed activation signal EN as a signal D1. The delay circuit 52 delays the signal D1 by a predetermined time, and outputs the delayed signal D1 as a signal D2. The delay circuit 53 delays the signal D2 by a predetermined time, and outputs the delayed signal D2 as a signal D3. The edge detection circuit 54 detects a rising edge or a falling edge of the activation signal EN, and outputs the detection result as the up-down control signal UDCTL. The selector 55 determines that each of the signals D1 to D3 is output as which one of the control signals EN1 to EN3, based on the up-down control signal UDCTL. Specifically, when the up-down control signal UDCTL indicates that the rising edge is detected by the edge detection circuit 54, the selector 55 outputs the signal D1 as the control signal EN1, outputs the signal D2 as the control signal EN2, and outputs the signal D3 as the control signal EN3. In addition, when the up-down control signal UDCTL indicates that the falling edge is detected by the edge detection circuit 54, the selector 55 outputs the signal D1 as the control signal EN3, outputs the signal D2 as the control signal EN2, and outputs the signal D3 as the control signal EN1.

Figure 17:
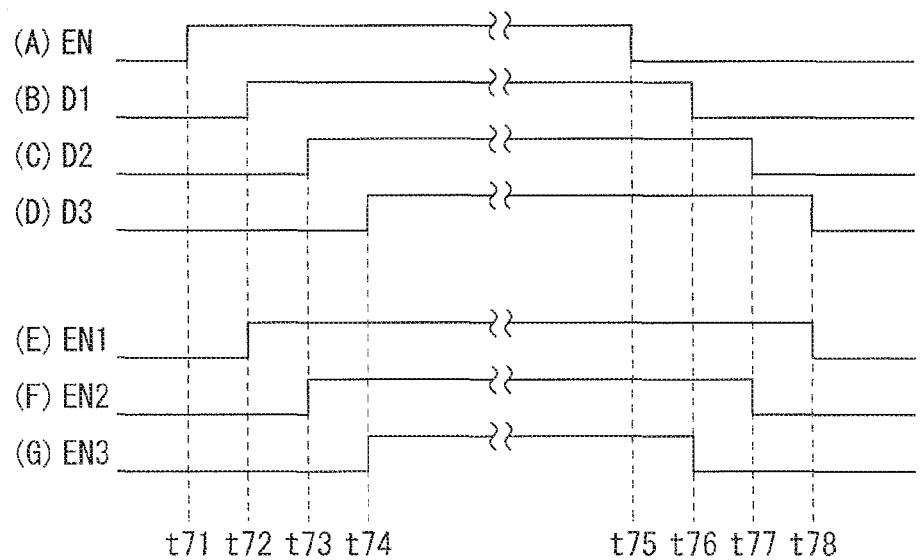
FIG. 17 is a timing waveform chart illustrating an operation example of the control signal generation section illustrated in FIG. 16.

FIG. 17 illustrates an operation example of the control signal generation section 50. When the activation signal EN changes from the low level to the high level at a timing t71 ((A) of FIG. 17), the edge detection circuit 54 detects the rising edge of the activation signal EN, and informs the selector 55 of the detection result through the up-down control signal UDCTL. Accordingly, in a period after the timing t71, the selector 55 outputs the signal D1 as the control signal EN1 ((B) and (E) of FIG. 17), outputs the signal D2 as the control signal EN2 ((C) and (F) of FIG. 17), and outputs the signal D3 as the control signal EN3 ((D) and (G) of FIG. 17). In addition, when the activation signal EN changes from the high level to the low level at a timing t75 ((A) of FIG. 17), the edge detection circuit 54 detects the falling edge of the activation signal EN, and informs the selector 55 of the detection result through the up-down control signal UDCTL. Accordingly, in a period after the timing t75, the selector 55 outputs the signal D1 as the control signal EN3 ((B) and (G) of FIG. 17), outputs the signal D2 as the control signal EN2 ((C) and (F) of FIG. 17), and outputs the signal D3 as the control signal EN1 ((D) and (E) of FIG. 17).

Figure 18:
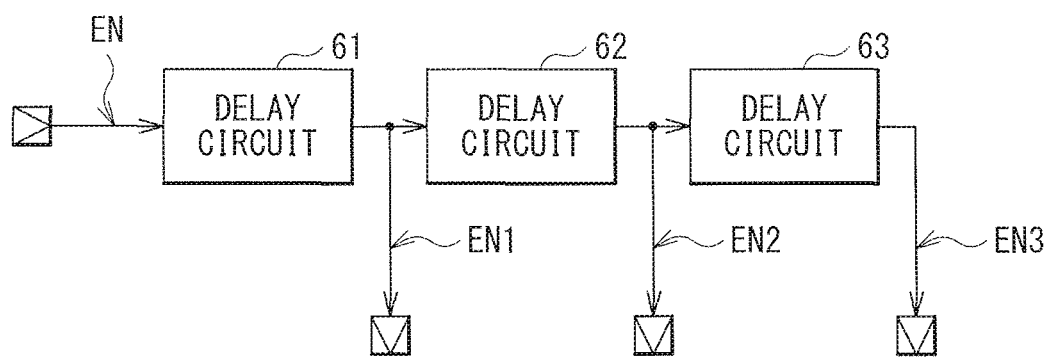
FIG. 18 is a block diagram illustrating a configuration example of a control signal generation section according to another modification.

FIG. 18 illustrates a configuration example of other control signal generation section 60 according to the present modification. The control signal generation section 60 includes delay circuits 61 to 63. The delay circuit 61 delays the activation signal EN by a predetermined time and outputs the delayed activation signal EN as a control signal EN1. The delay circuit 62 delays the control signal EN1 by a predetermined time and outputs the delayed control signal EN1 as a control signal EN2. The delay circuit 63 delays the control signal EN2 by a predetermined time and outputs the delayed control signal EN2 as a control signal EN3. After the activation signal EN becomes active, the control signal generation section 60 sequentially activates the control signals EN1 to EN3 in this order, and after the activation signal EN becomes inactive, the control signal generation section 60 sequentially inactivates the control signals EN1 to EN3 in this order. Specifically, after the activation signal EN becomes inactive, the control signal generation section 40 according to the above-described embodiment sequentially inactivates the control signals EN3 to EN1 in this order. However, the control signal generation section 60 according to the present modification sequentially inactivates the control signals EN1 to EN3 in this order. Also in this case, the variation of the power voltage VDD is allowed to be suppressed, and thus, it is possible to reduce possibility that the circuit performs malfunction as well as to reduce possibility that the circuit is destroyed or the reliability of the circuit is lowered.

Hereinbefore, the present technology has been described with reference to the embodiment and the modifications; however, the present technology is not limited to the embodiment and the like, and various modifications may be made.

For example, in the above-described embodiment and the like, the present technology is applied to the receiver in a wireless communication system. However, this is not limitative, and the present technology is applicable to apparatuses in various fields, having a circuit that performs intermittent operation.

Note that the effects described in the present specification are illustrative and non-limiting. Effects achieved by the technology may be effects other than those described above.

Note that the technology may be configured as follows.

(1) A semiconductor device including:
  a first signal generation section configured to generate an activation signal having a variable duty ratio; and
  a first processing section configured to perform intermittent operation, based on the activation signal.

(2) The semiconductor device according to (1), further including
  a second processing section, wherein
  the first signal generation section varies the duty ratio, based on an operation frequency of the second processing section.

(3) The semiconductor device according to (2), further including
  a power source section configured to supply power to the first processing section and the second processing section.

(4) The semiconductor device according to (2) or (3), wherein the first signal generation section counts pulses of a second clock signal by a number corresponding to the operation frequency in a period of a predetermined length indicated by a first clock signal, to generate the activation signal.

(5) The semiconductor device according to any one of (1) to (4), further including
a second signal generation section configured to generate a first control signal and a second control signal based on the activation signal, the first control signal and the second control signal being different in transition timing from each other, wherein
the first processing section includes
a first circuit block configured to perform the intermittent operation based on the first control signal, and
a second circuit block configured to operate based on an output signal of the first circuit block, and to perform the intermittent operation based on the second control signal.

(6) The semiconductor device according to (5), wherein the second circuit block is activated after the first circuit block is activated, in the intermittent operation.

(7) The semiconductor device according to (6), wherein the first circuit block stops operation after the second circuit block stops operation, in the intermittent operation.

(8) The semiconductor device according to any one of (5) to (7), wherein the second signal generation section counts up or counts down pulses of a third clock signal, based on a transition direction of the activation signal, and generates the first control signal and the second control signal based on the count value.

(9) The semiconductor device according to any one of (5) to (7), wherein the second signal generation section includes
a delay section configured to delay the activation signal to generate a plurality of signals different in transition timing from one another, and
a selector section configured to select one of the plurality of signals to output the selected signal as the first control signal, and configured to select another one of the plurality of signals to outputs the selected signal as the second control signal, based on the activation signal.

(10) The semiconductor device according to (5) or (6), wherein the second signal generation section delays the first control signal to generate the second control signal.

(11) A method of controlling a semiconductor device, the method including:
varying a duty ratio of an activation signal; and
allowing a first processing section to perform intermittent operation, based on the activation signal.

It should be understood by those skilled in the art that various modifications, combinations, sub-combinations, and alterations may occur depending on design requirements and other factors insofar as they are within the scope of the appended claims or the equivalents thereof.

What is claimed is:
1. A semiconductor device comprising:
a first signal generation section configured to generate an activation signal having a variable duty ratio;
a first processing section configured to perform intermittent operation, based on the activation signal; and
a second processing section, wherein
the first signal generation section varies the duty ratio, based on an operation frequency of the second processing section.
2. The semiconductor device according to claim 1, further comprising
a power source section configured to supply power to the first processing section and the second processing section.
3. The semiconductor device according to claim 1, wherein the first signal generation section counts pulses of a second clock signal by a number corresponding to the operation frequency in a period of a predetermined length indicated by a first clock signal, to generate the activation signal.
4. A semiconductor device comprising:
a first signal generation section configured to generate an activation signal having a variable duty ratio;
a first processing section configured to perform intermittent operation, based on the activation signal; and
a second signal generation section configured to generate a first control signal and a second control signal based on the activation signal, the first control signal and the second control signal being different in transition timing from each other, wherein
the first processing section includes
a first circuit block configured to perform the intermittent operation based on the first control signal, and
a second circuit block configured to operate based on an output signal of the first circuit block, and to perform the intermittent operation based on the second control signal.
5. The semiconductor device according to claim 4, wherein the second circuit block is activated after the first circuit block is activated, in the intermittent operation.
6. The semiconductor device according to claim 5, wherein the first circuit block stops operation after the second circuit block stops operation, in the intermittent operation.
7. The semiconductor device according to claim 4, wherein the second signal generation section counts up or counts down pulses of a third clock signal, based on a transition direction of the activation signal, and generates the first control signal and the second control signal based on the count value.
8. The semiconductor device according to claim 4, wherein the second signal generation section includes
a delay section configured to delay the activation signal to generate a plurality of signals different in transition timing from one another, and
a selector section configured to select one of the plurality of signals to output the selected signal as the first control signal, and configured to select another one of the plurality of signals to outputs the selected signal as the second control signal, based on the activation signal.
9. The semiconductor device according to claim 4, wherein the second signal generation section delays the first control signal to generate the second control signal.
10. A method of controlling a semiconductor device, the method comprising:
varying a duty ratio of an activation signal;
performing, by a first processing section, intermittent operation, based on the activation signal; and
varying, by the first signal generation section, the duty ratio, based on an operation frequency of a second processing section.
11. A semiconductor device comprising:
a first signal generation circuitry configured to generate an activation signal having a variable duty ratio;
a first processing circuitry configured to perform intermittent operation, based on the activation signal; and
a second processing circuitry, wherein the first signal generation circuitry varies the duty ratio, based on an operation frequency of the second processing circuitry.

12. The semiconductor device according to claim 11, further comprising
a power source circuitry configured to supply power to the first processing circuitry and the second processing circuitry.

13. The semiconductor device according to claim 11, wherein the first signal generation circuitry counts pulses of a second clock signal by a number corresponding to the operation frequency in a period of a predetermined length indicated by a first clock signal, to generate the activation signal.

14. The semiconductor device according to claim 11, further comprising:
a second signal generation circuitry configured to generate a first control signal and a second control signal based on the activation signal, the first control signal and the second control signal being different in transition timing from each other, wherein
the first processing circuitry includes:
a first circuit block configured to perform the intermittent operation based on the first control signal, and
a second circuit block configured to operate based on an output signal of the first circuit block, and to perform the intermittent operation based on the second control signal.

15. The semiconductor device according to claim 14, wherein the second circuit block is activated after the first circuit block is activated, in the intermittent operation.

16. The semiconductor device according to claim 15, wherein the first circuit block stops operation after the second circuit block stops operation, in the intermittent operation.

17. The semiconductor device according to claim 14, wherein the second signal generation circuitry counts up or counts down pulses of a third clock signal, based on a transition direction of the activation signal, and generates the first control signal and the second control signal based on the count value.

18. The semiconductor device according to claim 14, wherein the second signal generation circuitry includes:
a delay circuitry configured to delay the activation signal to generate a plurality of signals different in transition timing from one another, and
a selector circuitry configured to select one of the plurality of signals to output the selected signal as the first control signal, and configured to select another one of the plurality of signals to outputs the selected signal as the second control signal, based on the activation signal.

19. The semiconductor device according to claim 14, wherein the second signal generation circuitry delays the first control signal to generate the second control signal.

* * * * *